United States Patent [19]
Koike

[11] Patent Number: 5,375,260
[45] Date of Patent: Dec. 20, 1994

[54] RECEIVER UNIT FOR WIRELESS MICROPHONE APPLICATIONS

[75] Inventor: Yukinaga Koike, Matsumoto, Japan

[73] Assignee: Samson Technologies, New York, N.Y.

[21] Appl. No.: 638,700

[22] Filed: Dec. 27, 1990

[51] Int. Cl.$^5$ .............................................. H04B 1/16
[52] U.S. Cl. .................................... 455/208; 455/258; 455/341
[58] Field of Search ............... 455/343, 340, 341, 334, 455/150.1, 169.1, 266, 193.2, 196.1, 197.2, 255, 258, 261, 264, 205, 208; 331/116 R, 116 FE, 158; 330/297, 202

[56] References Cited
U.S. PATENT DOCUMENTS

| | | | |
|---|---|---|---|
| 3,219,932 | 11/1962 | Foster | 455/343 |
| 3,845,410 | 10/1974 | Steel | 331/116 R |
| 3,958,190 | 5/1976 | Minch | 331/116 R |
| 5,140,700 | 8/1992 | Kennedy | 455/340 |

*Primary Examiner*—Reinhard J. Eisenzopf
*Assistant Examiner*—Andrew Faile
*Attorney, Agent, or Firm*—Amster, Rothstein & Ebenstein

[57] ABSTRACT

An FM receiver is described having a minimal part topology wherein the self resonant characteristics of inductors is used as a tuning element. Power feed of the front end of the receiver is extracted from the intermediate frequency amplifier to reduce overall operating power requirements.

5 Claims, 3 Drawing Sheets

RECEIVER UNIT FOR WIRELESS MICROPHONE APPLICATIONS

FIELD OF THE INVENTION

The present invention relates to a wireless microphone system having transmitter and receiver units remotely positioned from each other wherein frequency modulated (FM) signals representing audible sounds are transmitted from the transmitter unit to the receiver unit. The receiver reproduces the audible sounds in response to the received FM signals. In particular, the present invention pertains to the receiver unit of the above wireless microphone system.

BACKGROUND OF THE INVENTION

A block diagram of a receiver unit of a typical prior art wireless microphone system is illustrated in FIG. 2. In general, as shown in FIG. 2, the receiver has an antenna 1 for receiving signals from an FM transmitter remotely located from the receiver and not shown in FIG. 2. The received FM signals are supplied to a radio-frequency amplifier 2 that amplifies the low level FM signal. The amplified radio-frequency FM signal is then supplied to a mixer 4. The mixer 4 combines the radio-frequency signal with a fixed frequency from a local oscillator 3 to output an intermediate frequency. The intermediate frequency contains the audio information yet to be extracted. The intermediate frequency is amplified via an intermediate-frequency amplifier 5 and then supplied to an FM detector 6. The output of the FM detector is the originally encoded low-frequency audio signal.

The low frequency, audio signal, is originally encoded and transmitted in the logarithmically compressed state for the purpose of eliminating noise in the FM encoding and transmission process. After reception, mixing and decoding, the audio signal is then logarithmically expanded through a logarithmic expander 7 to restore its original dynamic range. Typically, the output of the logarithmic expander 7, (output terminal 8), is amplified by a power amplifier (not shown) and then supplied to a speaker unit (also not shown).

The receiver unit of the above type is typically built from various circuit components as shown in FIG. 3. There are four major parts of interest in the receiver unit:

1) Radio frequency amplifier 2,
2) local oscillator 3,
3) mixer 4,
4) intermediate frequency amplifier 5

As shown in FIG. 3, the (FM) radio-frequency amplifier 2 of the prior art generally comprises:

I) a field-effect transistor Q1 having 20 decibels (dB) amplifying gain at its operating point,
II) a double-tuned circuit 2a between the gate of the transistor and the antenna 1,
III) a double-tuned circuit 2b between the drain of the transistor and the mixer 4.

The local oscillator 3 comprises
I) a crystal resonator X1,
II) a transistor Q4 for resonating the crystal oscillator X1 at its third harmonic, and
III) a multiple-stage transistor Q5 for multiplying the third harmonic by another factor of three. Thus, the original frequency of the crystal resonator X1 is multiplied by a factor of nine and is then supplied to the mixer 4 as the local oscillator frequency.

The mixer 4 has a current-feedback bias type transistor Q2. Items 2, 3, and 4 typically constitute the front end of the receiver.

The intermediate-frequency (IF) amplifier 5, is provided with a current-feedback bias type transistor Q3. In FIG. 3, reference numerals 4a and 5a denote ceramic filters.

Applications for wireless microphone systems include use with musical instruments, such as electric guitars, and with video cameras. In the latter applications, the receiver unit is installed on or in the camera itself to receive signals from a remote transmitter. One significant drawback to the use of wireless microphones in electric guitars, video cameras and other applications is the relatively high cost of wireless microphones systems, as well as the large size and weight of the systems. Given these market constraints, the receiver unit of the system should be preferably compact, inexpensive and light. For example, with respect to use of the system with an electric guitar, it is necessary to reduce the manufacturing price of the system to a level much lower than that of the guitar itself. For those goals to be achieved, the receiver unit of the prior art system described above must be modified to reduce the number of components to be assembled without degrading its performance or electrical characteristics.

SUMMARY OF THE INVENTION

Accordingly, an object of the present invention is to provide a receiver unit of an FM wireless microphone system having a receiver unit made up of a radio frequency amplifier, a local oscillator, a mixer and a first intermediate-frequency amplifier of an improved circuit configuration having a reduced number of components constituting the receiver.

Another object of the present invention is to provide a receiver unit of an FM wireless microphone system that is more reliable as compared to the prior art because it has fewer components.

Further objectives and advantages of the invention will become readily apparent as the description thereof proceeds.

The various objectives and advantages of the invention are realized in an arrangement where the receiver unit of a frequency modulated wireless microphone system using a radio frequency carrier operating between 100 and 300 megacycles is made up of a radio frequency amplifier having a first input and a first output. This tuned radio frequency amplifier in turn is made up of a first inductor having a first tap and a first and a second capacitor. These two capacitors are connected in series across the first inductor. The junction between said first and second capacitor is the input to this radio frequency amplifier. The amplifier also has a first transistor having a first collector, a first base and a first emitter. The base of this transistor is connected to the first tap through a third capacitor while the collector is connected to the self-resonating inductor whose resonating frequency X is also between 100 to 300 megacycles. The collector of this first transistor is also connected to a first tank circuit having the same resonant frequency X between the 100 and 300 megacycles.

This first tank circuit is made up of a capacitor and a (second) tapped inductor having a second tap. The output of the radio frequency amplifier is found at the second tap. A tank circuit is well known in the art as an inductor-capacitor combination tuned to oscillate at a frequency determined by the value of the inductor and the capacitor.

Another portion of the receiver unit is a local oscillator having an output. This unit is made up of a second transistor having a collector, a base and an emitter. A crystal resonator is connected to the base of this second transistor. The crystal resonator has a fundamental resonant frequency f. The choice of this frequency f is well known in the art to achieve the local oscillator function. The crystal oscillator works with the second transistor in conjunction with a second tank circuit. This second tank circuit is connected to the emitter of the second transistor, and has a resonant frequency 3f, three times that of the fundamental frequency of the crystal resonator. A third tank circuit is connected to the collector of the second transistor, having a resonant frequency 9f, nine times that of said crystal resonator. The 9f resonant frequency of the third tank circuit is the output from the local oscillator. This configuration forces the operating frequency of the crystal resonator to be 3f.

Yet another portion of the receiver unit is the mixer for combining the output from the radio frequency amplifier, and the output from the local oscillator. This mixer is made up of a third transistor having a collector, a base and an emitter. The base of this transistor is capacitively coupled to the output of the radio frequency amplifier and also connected to the output from the local oscillator.

A transformer is also part of the mixer. The transformer has a primary coil and a secondary coil. The primary coil has a center tap and a first and second terminal at the respective ends of the primary winding. A capacitor is connected between the first and second terminal of the transformer primary coil. The primary coil now forms a tuned circuit with the capacitor.

The collector of the mixer transistor is connected to the center tap of the primary coil of the transformer, while a ceramic filter is connected to the secondary coil of the transformer. A first resistor is connected to the first terminal of the primary coil and a source of electrical power such as a D.C. power supply. A second resistor is connected to the same first terminal and the transistor base, cooperatively operating with said first resistor to self bias the transistor in this portion of the receiver unit.

Another portion of the receiving unit is the intermediate frequency (IF) amplifier connected to output from the mixer. This IF amplifier is made up of a fourth transistor having a collector, a base and an emitter. The collector is connected to a resistor and a (second) ceramic filter; this resistor is connected to another resistor. The last resistor is also connected to the same source of electrical power the mixer stage was connected to.

The junction of these two resistors also connected to yet another resistor, which in turn is connected to the base of the transistor of this portion. This configuration of resistors will cooperatively self bias the transistor. A capacitor is connected to the emitter of the transistor. This emitter is also connected through a resistor to the self-resonating inductor previously described as being part of the radio frequency amplifier. This connection allows operating power from the emitter of the transistor in this I.F. stage to activate the transistor in the radio frequency amplifier.

BRIEF DESCRIPTION OF THE DRAWINGS

Features of the invention which are believed to be novel are set forth with particularity in the appended claims. The invention itself, however, together with its further objects and advantages thereof, may be best understood by reference to the following description, when taken in conjunction with the accompanying drawings, in which:

PREFERRED EMBODIMENT

Figure 1:
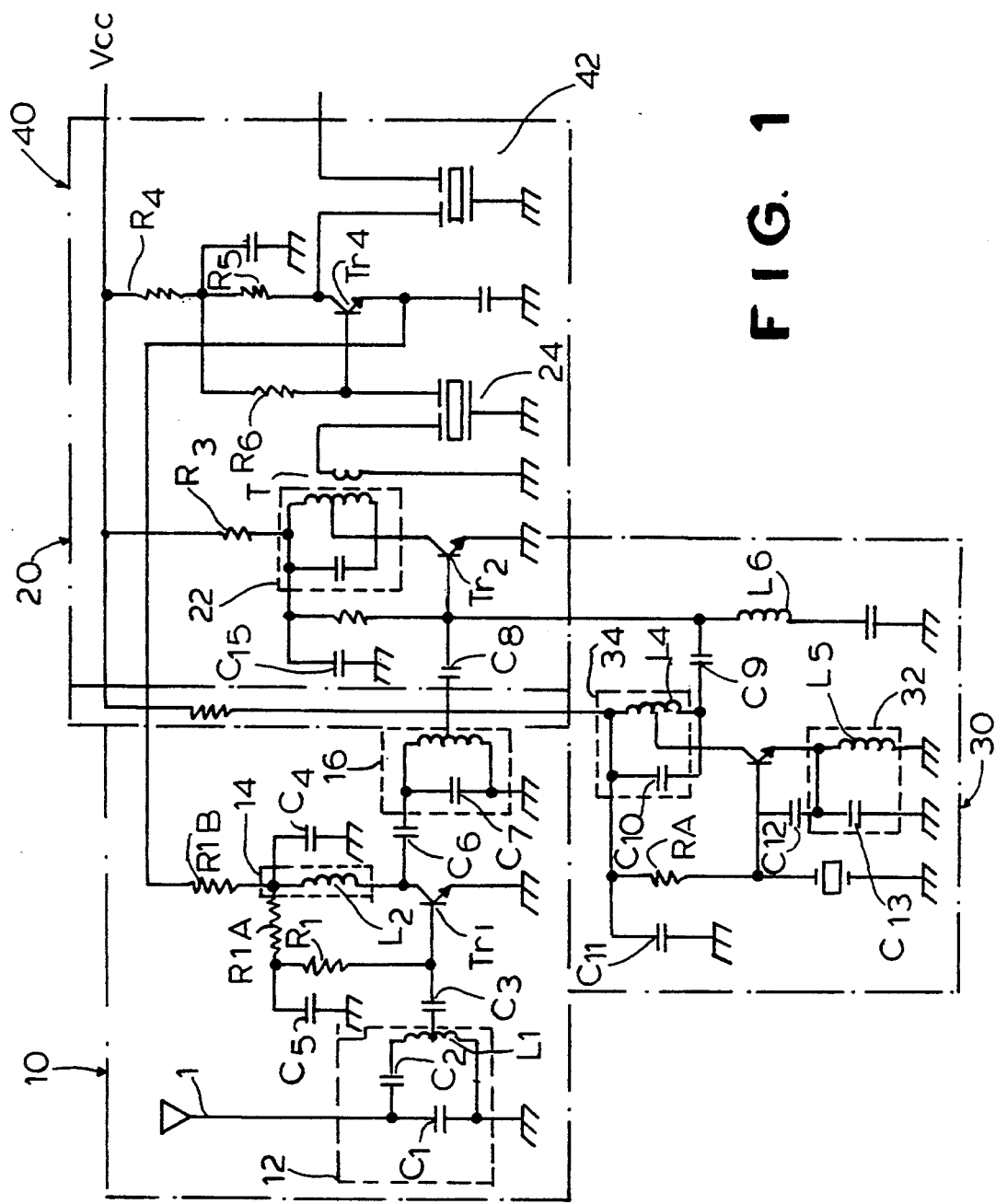
FIG. 1 is a schematic diagram of the radio frequency amplifier mixer and intermediate-frequency amplifier of a receiver unit of a wireless microphone system according to the present invention.
Figure 2:
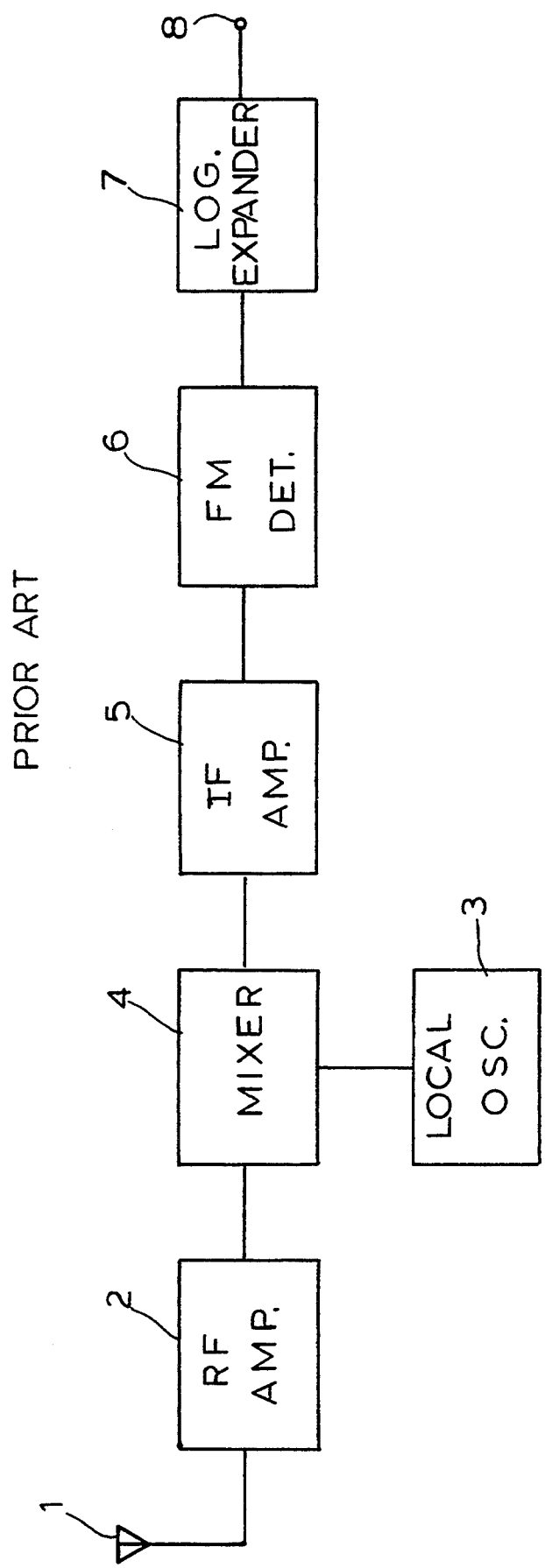
FIG. 2 is a block diagram of a typical receiver unit of a wireless microphone system; and, FIG. 3 is a schematic diagram of the front end portion and first intermediate-frequency amplifier of a typical prior art receiver of a wireless microphone system.

FIG. 1 is a schematic diagram of the block diagram shown in FIG. 2 except for the FM detector (item 6) and expander (item 7) of a receiver unit in accordance with the present invention. The receiver unit comprises a radio-frequency amplifier 10 having a single-tuned circuit stage 12 between the base of a transistor Tr1 and an antenna 1 and tuned-circuits 14, 16 part of the collector circuit of the transistor Tr1.

Figure 3:
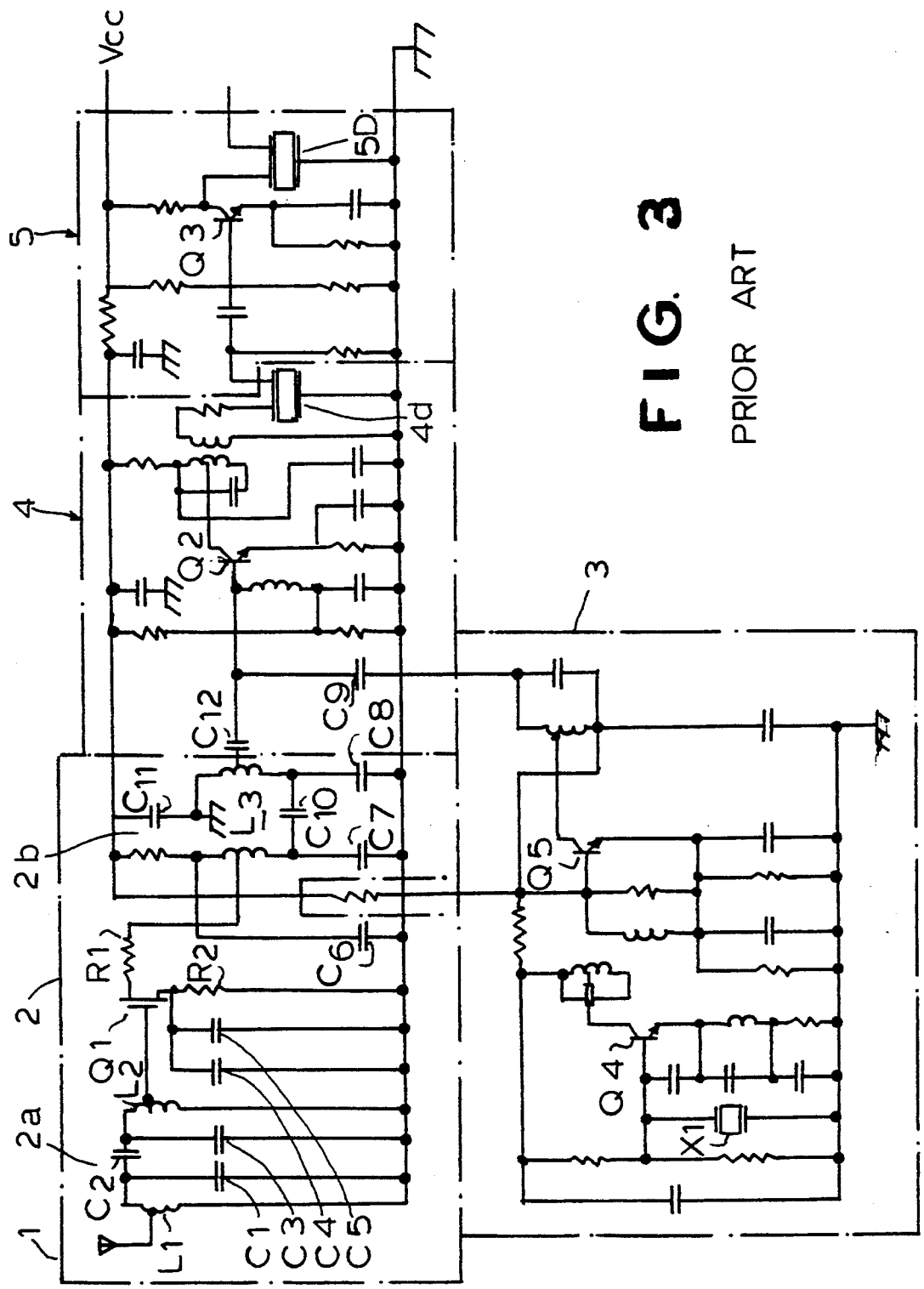

Single-tuned stage 12 is comprised of capacitors $C_1$, $C_2$ and a Coil $L_1$. The antenna 1 is connected to the capacitors $C_1$ and $C_2$ dividing the tuning capacitance for antenna impedance matching purposes. In the configuration shown in FIG. 1, the number of elements to be assembled is reduced in comparison to the conventional circuit having the double-tuned circuit shown in FIG. 3. Because the $C_1$, $C_2$, $L_1$, combination in FIG. 1 is generally substituted for the $L_1$, $L_2$, $C_1$, $C_2$, $C_3$ combination in the prior art, FIG. 3, a net savings of parts is achieved.

The base of transistor Tr1 is connected to the middle tap of the coil $L_1$ via the coupling capacitor $C_3$ in order to match impedance between the base of the transistor and $C_1$, $C_2$ and $L_1$.

Note that the radio-frequency amplifier 10 is not supplied with power directly from the Vcc (D.C.) power source, but it is supplied with current from the intermediate-frequency amplifier as shown in FIG. 1. This reduces the overall power drain of the receiver as a whole.

The tuned-circuit 14 of the radio-frequency amplifier 10 in the collector circuit of TR1 is comprised of a single choke coil $L_2$. By utilizing the distributed capacitance of this choke coil $L_2$ at the (high-frequency) operating band, a tank circuit can be realized having a low Q-value, and at the same time impedance matching can also be obtained. The use of the self-resonating choke coil also contributes to the reduction in number of the components of the circuit. Reference numerals $C_4$ and $C_5$ denote by-pass capacitors, while $C_6$ and $R_1$, R1A and R1B denote a coupling capacitor and a bias resistors, respectively.

As shown in FIG. 1, the mixer 20 comprises a tuned circuit 22 having a transistor Tr2. Tuned circuit 22 is made up of a center tapped primary coil of transformer T in the collector circuit and capacitor, $C_0$, connected in the collector circuit of Tr2. Capacitor $C_0$ is in parallel with the primary coil of T thereby forming a tuned circuit. A ceramic filter 24 is in the secondary coil of transformer T. The bias circuit of the transistor Tr2 comprises resistors R2 and R3 forming a self-bias circuit. The self-bias circuit contributes to the reduction in number of components in comparison with the conventional current-feedback bias circuit.

The local oscillator 30 comprises a crystal resonator X, a transistor Tr3, a tank circuit 32 connected to the emitter of transistor Tr3, and a tank circuit 34 connected to the collector of the transistor Tr3. The resonance frequency of the tank circuit 32 is three times as high as the fundamental frequency of the crystal resonator X, whereas that of the other tank circuit 34 is nine time as high as that of the fundamental frequency of crystal resonator X. The provision of the tank circuit 32 makes the crystal resonator X operate at three times (3X) overtone frequency. On the collector of the transistor Tr3 the nine-time overtone frequency appears as the local oscillator frequency. Accordingly, the crystal resonator X is controlled to oscillate at the three-time overtone frequency, not the original fundamental frequency, so that no multiple stages are required after transistor Tr3. This lack of additional stages reduces the number of components to be assembled.

The first intermediate-frequency amplifier 40 includes a self-bias circuit comprised by a transistor Tr4 and resistors R4, R5 and R6. The impedance of the ceramic filter 42 is low, and so the load resistance of the collector becomes low. There is no emitter resistance for current-feedback bias as in the conventional circuit. Now, the emitter-voltage can be used as the source voltage for transistor TR1 in the radio-frequency amplifier 10. The self-bias circuit of the first intermediate-frequency amplifier 40 contributes to the reduction in number of the components comprising the circuit. The reuse of the emitter-voltage saves power consumed by the assembly.

An example of the parts used in above wireless receiver is shown in TABLE A. This is a list of the relevant parts keyed to FIG. 1 used to manufacture the subject invention.

TABLE A

| Typical part values used in FIG. 1 | | |
| --- | --- | --- |
| C1 | 33 | picofarads * |
| C2 | 18 | picofarads * |
| C3 | 220 | picofarads |
| C4 | 220 | picofarads |
| C5 | 220 | picofarads |
| C6 | 0.5 | picofarads |
| C7 | 12 | picofarads * |
| C8 | 3 | picofarads |
| C9 | 0.5 | picofarads |
| C10 | 12 | picofarads * |
| C11 | 102 | picofarads |
| C12 | 33 | picofarads |
| C13 | 22 | picofarads |
| C15 | 103 | picofarads |

L1 - .032 micro-henries
L2 - 1 micro-henries
L3 - .032 micro-henries
L4 - 122 micro-henries
L5 - 1 micro-henries
L6 - 1 micro-henries
R1 - 2200 ohms
R1A - 220000 ohms
R1B - 1000 ohms
RA - 220000 ohms
R3 - 3300 ohms TABLE A-continued

| Typical part values used in FIG. 1 |
| --- |
| R2 - 220000 ohms |

*These values are for carrier frequency of 174.6 MHz and local oscillator output frequency of 163.9 MHz modify for other operating frequencies.
X - crystal oscillator for local oscillator operation at 163.9 MHz for carrier frequency of 174.6 MHz is 18.211 MHz Many other modifications and additions from the illustrated embodiments may be made without departing from the spirit or scope of the invention, which is indicated by the appended claims and equivalents thereto.

I claim:

1. A receiver unit of a frequency modulated wireless microphone system using a frequency modulated carrier having a radio frequency amplifier having a radio frequency first output, a local oscillator having a fixed frequency second output, a mixer for combining said first and second outputs to produce an intermediate frequency third output and an intermediate frequency amplifier wherein electrical power used by said radio frequency amplifier is supplied from said intermediate frequency amplifier.

2. A receiver unit of a frequency modulated wireless microphone system using a frequency modulated carrier having a frequency selective radio frequency amplifier, wherein said frequency selective radio frequency amplifier comprises a self resonant inductor having a range of resonating frequencies and wherein said amplifier receives frequency modulated signals and amplifies those frequencies which fall within the range of frequencies of said self resonant inductor and further comprising an intermediate frequency amplifier wherein the electrical power used by said radio frequency amplifier is supplied from said intermediate frequency amplifier.

3. A receiver unit of a frequency modulated wireless microphone system using a frequency modulated carrier having a radio frequency amplifier having a first output frequency, a crystal resonator controlled local oscillator having a second output frequency, and a mixer for combining said first and second output frequencies, wherein said crystal controlled oscillator comprises a crystal resonator having a fundamental frequency and an operating frequency, said operating frequency being one third that of said second output frequency of said local oscillator while said fundamental frequency of said crystal resonator is one ninth of said second output frequency and further comprising an intermediate frequency amplifier wherein the electrical power used by said radio frequency amplifier is supplied from said intermediate frequency amplifier.

4. A receiver unit of a frequency modulated wireless microphone system using a frequency modulated carrier as described in claim 3, wherein said crystal controlled oscillator has a second output frequency, said crystal controlled local oscillator comprising a transistor, a first tank circuit connected to the emitter of said transistor and tuned to one third of said second output frequency of said local oscillator an a second tank circuit connected to the collector of said transistor and tuned to said second output frequency.

5. A receiver unit of a frequency modulated wireless microphone system using a radio frequency carrier operating between 100 and 300 megacycles comprising:

a) a radio frequency amplifier having a first input and a first output comprising:

i) a first inductor having a first tap and a first and a second capacitor, said first and second capacitor connected in series across said first inductor, wherein the junction between said first and second capacitor is said first input;

ii) a first transistor having a first collector, a first base and a first emitter;

iii) said first base connected to said first tap through a third capacitor;

iv) said first collector connected to a self-resonating inductor whose resonating frequency N is between said 100 to 300 megacycles;

v) said first collector also connected to a first tank circuit having same said resonant frequency N between said 100 and 300 megacycles, said first tank circuit comprising a fourth capacitor and a second tapped inductor having a second tap, wherein said output of said radio frequency amplifier is at said second tap;

b) a local oscillator having a second output comprising:

i) a second transistor having a second collector, a second base and a second emitter;

ii) a crystal resonator connected to said second base of said second transistor said crystal resonator having a resonant frequency f;

iii) a second tank circuit, connected to emitter of said second transistor, having a resonant frequency 3f, three times that of said crystal resonator;

iv) a third tank circuit, connected to collector of said second transistor, having a resonant frequency 9f, nine times that of said crystal resonator, wherein said 9f resonant frequency of said third tank circuit is said second output;

c) a mixer for combining said first output and said second output, said mixer having a third output, comprising:

i) a third transistor having a third collector, a third base and a third emitter;

ii) said third base capacitively coupled to said first output from said radio frequency amplifier and also connected to second output from said local oscillator;

iii) a transformer, having a primary coil, said primary coil having a center tap and a first and second terminal, and a secondary coil;

iv) a fifth capacitor connected between first and second terminal of said primary coil thereby forming a tuned circuit with said primary coil;

v) said third collector connected to said center tap of said primary coil of said transformer;

vi) a first ceramic filter connected to said secondary coil;

vii) a first resistor connected to said first terminal of said primary coil and a source of electrical power;

viii) a second resistor connected to said first terminal and said third base, cooperatively operating with said first resistor to self bias said third transistor;

d) an intermediate frequency amplifier connected to said third output comprising:

i) a fourth transistor having a fourth collector, a fourth base and a fourth emitter;

ii) said fourth collector connected to a third resistor and a second ceramic filter;

iii) said third resistor connected to a fourth resistor, said fourth resistor also connected to said source of electrical power;

iv) said third and fourth resistors also connected to a fifth resistor, said fifth resistor also connected to said fourth base, cooperatively operating with said third and fourth resistor to self bias said fourth transistor;

v) a sixth capacitor connected to said fourth emitter;

vi) said fourth emitter connected through a sixth resistor to said self-resonating inductor wherein power from said fourth emitter is provided for said first transistor operation.

* * * * *